United States Patent
Tikka

(10) Patent No.: US 6,742,583 B2
(45) Date of Patent: Jun. 1, 2004

(54) COOLING SYSTEM FOR A CABINET

(75) Inventor: Harri Tikka, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/812,191

(22) Filed: Mar. 19, 2001

(65) Prior Publication Data

US 2001/0052412 A1 Dec. 20, 2001

Related U.S. Application Data

(63) Continuation of application No. PCT/FI00/00676, filed on Aug. 9, 2000.

(30) Foreign Application Priority Data

Aug. 20, 1999 (FI) ................................. 19991765

(51) Int. Cl.[7] .......................... G05D 23/00; F25G 23/12
(52) U.S. Cl. ....................... 165/291; 165/261; 165/288; 62/259.2; 454/184
(58) Field of Search .......................... 165/287, 104.33, 165/104.34, 291, 260, 261, 288; 62/259.2; 454/184

(56) References Cited

U.S. PATENT DOCUMENTS

| | | | | |
|---|---|---|---|---|
| 3,559,728 A | * | 2/1971 | Lyman et al. .......... | 165/104.34 |
| 3,749,981 A | * | 7/1973 | Koltuniak et al. .. | 165/104.34 X |
| 4,386,651 A | * | 6/1983 | Reinhard ........... | 165/104.34 X |
| 4,729,424 A | * | 3/1988 | Mizuno et al. ............. | 165/261 |
| 5,035,281 A | * | 7/1991 | Neuenfeldt et al. . | 165/104.34 X |
| 5,076,346 A | * | 12/1991 | Otsuka .................... | 165/291 X |
| 5,332,031 A | * | 7/1994 | Kiga ...................... | 62/259.2 X |
| 5,474,120 A | * | 12/1995 | Severson et al. ...... | 62/259.2 X |
| 5,655,381 A | * | 8/1997 | Huttenlocher et al. . | 62/259.2 X |
| 5,806,583 A | | 9/1998 | Suzuki et al. .......... | 165/104.33 |
| 5,813,243 A | * | 9/1998 | Johnson et al. ......... | 62/259.2 X |
| 5,832,988 A | * | 11/1998 | Mistry et al. ....... | 165/104.33 X |
| 5,860,291 A | * | 1/1999 | Johnson et al. ......... | 62/259.2 X |
| 5,934,079 A | | 8/1999 | Han et al. ..................... | 62/3.2 |
| 6,041,851 A | * | 3/2000 | Diebel et al. .......... | 165/104.33 |
| 6,082,441 A | * | 7/2000 | Boehmer et al. | |
| 6,104,003 A | * | 8/2000 | Jones ................. | 165/104.33 X |
| 6,127,663 A | * | 10/2000 | Jones | |
| 6,142,866 A | * | 11/2000 | Wright ....................... | 454/184 |
| 6,166,905 A | * | 12/2000 | Oyamada et al. ........ | 454/184 X |
| 6,330,152 B1 | * | 12/2001 | Vos et al. .............. | 62/259.2 X |
| 6,341,064 B1 | * | 1/2002 | Bradley .................. | 62/259.2 X |
| 6,400,567 B1 | * | 6/2002 | McKeen et al. ....... | 62/259.2 X |

FOREIGN PATENT DOCUMENTS

| | | |
|---|---|---|
| GB | 2197536 | 5/1988 |
| JP | 11135972 | 5/1999 |
| WO | WO 96/19046 | 6/1996 |

* cited by examiner

*Primary Examiner*—Ljiljana Ciric
(74) *Attorney, Agent, or Firm*—Squire, Sanders & Dempsey L.L.P.

(57) ABSTRACT

A bipartite cooling system comprises a first set of cooling equipment that provides for closed cooling air circulation inside a cabinet and a second set of cooling equipment that provides for open cooling air circulation inside the cabinet. For most of the year, cooling of the cabinet can be handled with the first set of cooling equipment, which consists of an air-to-air heat exchanger. For the short period of time that the heat exchanger alone cannot ensure sufficient cooling of the air inside the cabinet, the second set of cooling equipment provides through-flow air circulation. This is achieved by drawing air into the cabinet through a filter and blowing warmed-up air out.

12 Claims, 2 Drawing Sheets

COOLING SYSTEM FOR A CABINET

This application is a continuation of PCT/FI00/00676 filed on Aug. 9, 2000.

FIELD OF THE INVENTION

The present invention relates, in general, to the control of the internal atmosphere in equipment rooms. It is specifically concerned with the temperature control in electrical and telecommunications equipment cabinets located in environments where cooling is required to ensure reliable operation.

BACKGROUND

Maintaining the temperature of the air within specified limits inside electrical and telecommunications cabinets, which will below be referred to by the more generic term "equipment cabinets", such as outdoor equipment cabinets is important in order to ensure normal operation. An excessively high indoor air temperature will shorten the service life of equipment and may cause malfunctions. There exists a maximum permissible temperature for air inside outdoor installation cabinets containing telecommunications equipment, and if this temperature limit is exceeded, the equipment will be switched off to avoid damage.

Base transceiver stations for mobile communications networks are increasingly being installed out of doors in locations such as roofs, walls and, where possible, on the ground. The need for equipment cabinets suitable for outdoor installation is evident.

The heat generated by the equipment inside the cabinet essentially affects the air temperature inside the cabinet. In the case of a base transceiver station, the components that produce most heat are the transmitters on the transmitter/receiver units (TRX units). Other major sources of heat are the power supply unit and various output stages. Where the amount of heat being generated is not very high, gravity air circulation is enough to dissipate the heat. This is a suitable solution for geographical areas where the outdoor temperature does not reach a high level. Where the outdoor air temperature is high, forced air circulation may be used. This is accomplished by drawing ambient-temperature air from outside the equipment cabinet, routing it through a filter and sucking the filtered air with a fan into the cabinet. The air passes through the cabinet, absorbing heat generated by the components, and the warmed-up air is blown out of the cabinet. Forced air circulation can be used to prevent the air temperature inside the cabinet from exceeding the outdoor temperature.

The advantage of gravity and forced air circulation lies in its low cost and simplicity. The drawbacks include the ingress of moisture, small particles and gaseous impurities into the equipment cabinet. Where the temperature and/or humidity of the ambient air fluctuates greatly, as in tropical conditions, for example, humidity inside the cabinet condenses. Typically, condensation occurs when the outdoor temperature falls in the evening and at night; this causes the temperature of the air inside the cabinet to drop, resulting in a decreased capacity to contain moisture. Condensation on surfaces may adversely affect the operation of electrical equipment. Moreover, the units inside the cabinet must be encased to prevent contamination, which complicates maintenance and servicing. In areas with a lot of dust, filters tend to clog quickly and must be replaced frequently. In cold climates, the filters can freeze over and be blocked by snow.

However, large volumes of heat cannot be removed from a closed space without equipment performing mechanical work, such as air-to-air heat exchangers, air-to-liquid heat exchangers or heat-pipe heat exchangers that are all here collectively referred to as heat exchangers. Equipment cabinets fitted with heat exchangers are designed to operate in the medium temperature range. Medium temperature refers to outdoor air temperatures up to +40° C.

The advantages of using a heat exchanger include its technical reliability and the fact that cabinets can be sealed and weatherproofed to facilitate impurity and humidity control. The drawback is that because the temperature difference between the heat exchanger inlet and outlet side is about 15° C., the internal temperature of electronic components may, at high outdoor temperatures, easily exceed the maximum permissible limits. For this reason, equipment cabinets fitted solely with heat exchangers cannot be used when the ambient temperature exceeds +40 C.

A third known method of controlling temperature is to use an air-conditioning unit. This incorporates a cooling unit containing liquids, such as Freon, that evaporate at a low temperature to maintain the temperature inside the cabinet at a suitable level even if the ambient temperature exceeds 40° C. Humidity can be controlled and the equipment cabinet can be completely sealed. The disadvantage is that the air-conditioning unit is an expensive piece of technical equipment that requires servicing and consumes a lot of energy.

Publication WO 96/19046 suggests that the equipment cabinet be divided into two compartments that are isolated from each other by an airtight wall. The first compartment houses equipment that generates a lot of heat, such as transmitters that are encased in housings fitted with cooling fins. The second compartment houses equipment that produces little heat. The first compartment is cooled using forced air circulation by drawing air from the outside and blowing it across the cooling surfaces of the housings out of the cabinet. The second compartment is cooled by an air-to-air heat exchanger located in the first compartment. Thus, the forced air circulation in the first compartment cools the heat exchanger, so that heat is transferred from the closed air circuit of the second compartment, which incorporates a fan, to the first compartment and then outside via the heat exchanger.

The solution presented in the said WO Publication permits the operation of the equipment cabinet even at high outdoor temperatures because components generating a lot of heat are cooled by the forced circulation of air drawn from outside. The disadvantage is that the equipment must be carefully encased and sealed to prevent contamination and to improve the efficiency of heat transfer. An equipment cabinet that is split into two compartments allowing for the provision of separate cooling systems for the compartments is an expensive special design. Placing the telecommunications components in two compartments within the cabinet and installing the cabling between the components in separate compartments also increase costs.

The objective of the present invention is to provide a multi-purpose cooling system for an equipment cabinet that permits the operation of telecommunications equipment over a wide temperature range and, specifically, at extremely high outdoor temperatures common around the equator. However, the cooling system of an equipment cabinet should be as simple as possible and made of standard components and, preferably, such that no special casings around the components are required.

SUMMARY OF THE INVENTION

The present invention is based on the observation that even in the hottest regions the period during which extremely high temperatures of over +40° C. or even over +50° C. occur is relatively short and that most of the time the temperature remains below +40° C. Thus, the cooling system can be bipartite with the first section consisting of a cooling system with a closed circulation of the air inside the cabinet and the second section consisting of a cooling system with an open circulation of the air inside the cabinet.

The cooling system utilizes a control logic that directs the first set of cooling equipment alone to cool the air inside the cabinet at temperatures within a temperature range below a certain predefined outdoor temperature. The control logic switches on the second set of cooling equipment when a predefined outdoor temperature is reached.

Consequently, for most of the year, the cooling of the cabinet can be effected using the first set of cooling equipment that incorporates an air-to-air heat exchanger. During the short period of time when the heat exchanger cannot cool the equipment cabinet efficiently enough, the second set of cooling equipment with forced flow-through air circulation will be engaged. For cooling, the second set of equipment uses filtered outdoor air without processing it in any way. Because this period of time is short it is not necessary to encase the equipment and the risk of the filters getting clogged is so low that they need not be replaced often. By optimising the operation of the heat exchanger and through-flow air circulation according to the geographical area where the equipment cabinet is located and by giving due consideration to the specific conditions prevailing at the installation site, such as wind, the sun exposure/shadow ratio, etc., it is possible to achieve the best possible performance.

Tapping air directly from the heat exchanger and/or the through-flow air circulation inlet by means of tubing can further enhance the cooling of selected pieces of equipment. Selected equipment can also be heated by placing a heating resistor in their vicinity. Installing heat sources close to critical components and using them to warm up such components near the operating temperature facilitates, among other things, the cold start of a base transceiver station. This is necessary if the outdoor air temperature at the cabinet installation site falls below zero.

BRIEF DESCRIPTION OF THE DRAWINGS

In the following, the invention is explained in more detail with reference to the enclosed drawings where.

DETAILED DESCRIPTION OF THE INVENTION

Figure 1:
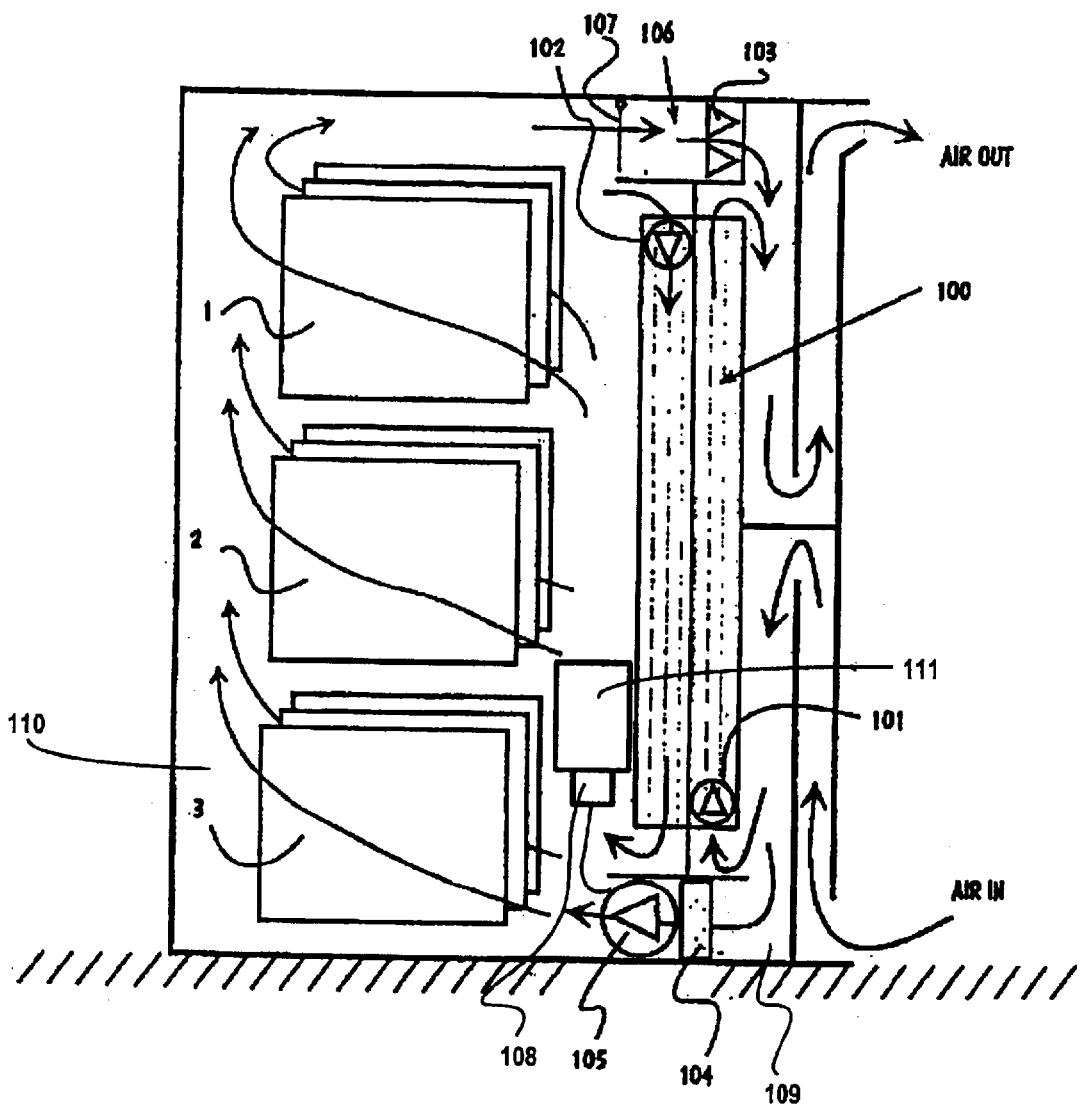
FIG. 1 shows how the cabinet is cooled.

FIG. 1 shows an equipment cabinet in accordance with the invention in cross-section. The equipment cabinet is designed for outdoor installation and contains, in this example, the components incorporated in the base transceiver station in a mobile communications network. However, it is not essential to the invention what telecommunications components the cabinet contains, nor is it important how they are installed inside it. For example, the cabinet may feature a rack on which the components are mounted. In the figure, the components are simply denoted by numbers 1, 2 and 3 and they could be plug-in units, TRX units, power supply units, etc.

The same equipment cabinet is designed to operate both at the normal operating temperature range of −33° C. to +40° C. and the high outdoor temperature range of +40° C. to +50° C. Within the first temperature range, cooling is provided by the heat exchanger, and when the temperature reaches the high-temperature range, cooling efficiency will be enhanced by outdoor air drawn in through a filter. The structure and operation of the equipment cabinet is first explained within the normal temperature range and then within the high-temperature range.

Within the normal temperature range, cooling is provided by the air-to-air heat exchanger 100 mounted on the equipment cabinet wall. Suitable heat exchangers are, for example, reverse-flow and cross-flow plate heat exchangers and pipe heat exchanger structures. Other types of heat exchangers may also be used. The outdoor air circulation fan 101 is used to draw air to the air inlet section of the exchanger through the air inlet. The outdoor air passes through the heat exchanger along the canals and leaves through the air outlet duct. The travel path of the inlet air is illustrated by the arrows. Power control of the outdoor air circulation fan is continuously adjustable, adjustable in steps or by using the on/off method, depending on the cooling needs of the telecommunications components inside the cabinet.

The side of the heat exchanger next to the equipment cabinet is separated from the outdoor side. Air heated inside in the equipment cabinet is forced by the internal air circulation fan 102 to the heat exchanger in such a way that the heat inside the equipment cabinet is transferred, via convective surfaces, to the outdoor air flowing in the outdoor air side of the heat exchanger. Air cooled in the heat exchanger inside the cabinet is rerouted back into the equipment cabinet. The cooled air in turn cools the surfaces of the telecommunications equipment inside the cabinet; it is warmed up as it rises and the warmed-up air is directed back to the heat exchanger. Air circulation is denoted by the arrows. Power control of the internal air circulation fan is continuously adjustable, adjustable in steps or by using the on/off method.

When the outdoor air temperature is approx. +40° C., the air drawn from the cabinet side of the heat exchanger has a temperature of about +55° C., assuming that the difference in temperature between the heat exchanger inlet and outlet side is 15° C. The surface temperature of the telecommunications components is considerably higher. As a matter of fact, their internal temperature may be so critically high as to jeopardise its faultless operation. When the outdoor temperature exceeds +40° C., the cooling capacity of the heat exchanger is no longer sufficient. For this reason, the cabinet also features through-flow air cooling directly with outdoor air.

On the suction side, the through-flow cooling circuit incorporates the filter 104 and fan 105 and on the outlet side for warmed-up internal air the controller 103 is used for adjusting the volume of air to be removed. Power control of the fan is continuously adjustable, adjustable in steps or by using the on/off method. Controller 103 may also regulate the volume of air continuously flowing out of the cabinet, in steps and within the normal temperature range when through-flow cooling is not used and the control switches are off.

When the outdoor air temperature exceeds 400° C., the fan switch 108 switches the fan 105 on. If the fan's power control is continuously adjustable, the fan runs initially at low power. It draws outdoor air from the inlet duct 109 through the filter 104 and blows it to the lower section of the equipment cabinet. From there, the air rises up, cooling the telecommunications components 1, 2 and 3. Warmed-up air passes out of the cabinet via the outlet opening 106 in the upper section of the cabinet. The controller 103 mounted on the outlet duct is used for controlling the volume of warmed-up air flowing out of the cabinet. If necessary, an exhaust fan can also be fitted in the outlet opening. The outlet opening also features the door 107, which is closed when through-flow is not in operation. The door may be replaced by any suitable closing mechanism. The closing mechanism can also be omitted, but then it is advisable to mount a filter (not shown) in the outlet opening to prevent the ingress of impurities into the equipment cabinet.

Preferably, the heat exchanger circulation should also be maintained at the extreme temperatures of +40° C. to 50° C. in order to minimise the utilisation rate of the filter circuit of the gravity air circulation system. The lower the utilisation rate, the more slowly the filter is clogged and the fewer impurities find their way inside the equipment cabinet. The heat exchanger can be over-sized, which makes it possible to rely on the heat exchanger at higher temperatures and thus reduce the utilisation rate of the filter circuit and the need for filter replacements. Increasing the efficiency of the heat exchanger will also reduce the need for gravity air circulation.

The filter circuit can be built separately or it can be integrated with the heat exchanger circuit so that the heat exchanger internal air circulation fan provides the fresh air supply and the heat exchanger outdoor air circulation fan takes care of blow-out of gravity system air out of the equipment cabinet.

Preferred additional features can be incorporated in the proposed equipment cabinet design. These include a humidity sensor for measuring humidity inside the cabinet, a humidity controller, temperature sensor, fan motor speed controllers, pressure differential measurements across the filter, air-tight doors for the filter circuit inlet and outlet openings, etc. Controls for these functions can be incorporated in the same control board 111. It is advisable to keep the filter circuit doors closed if the cabinet is installed in extremely tough environmental conditions where ingress of saline fog or chemicals into the equipment cabinet is probable.

It is advisable to maintain a slight positive pressure inside the equipment cabinet. With this design, the low volume of air leaving the cabinet will be replaced by fresh outdoor air drawn via the filter.

Figure 2:
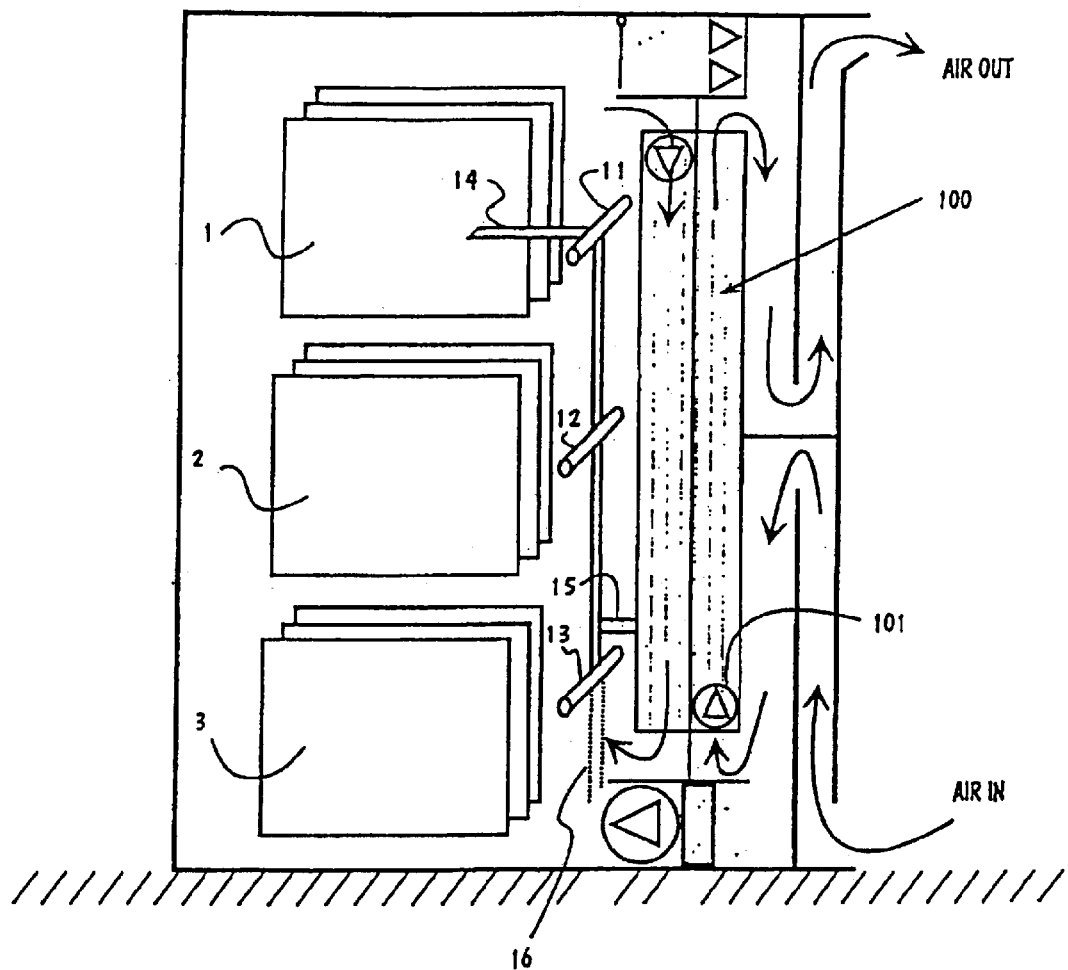
FIG. 2 shows an equipment cabinet featuring additional point-like cooling.

FIG. 2 illustrates one way of enhancing cooling performance. The figure is similar to FIG. 1 and the component references are identical, where applicable. To improve cooling, a tube is installed from the cool end of the heat exchanger to carry cooling air to the desired point. Several optional designs are feasible. In the figure, several headers (11, 12, 13, and 14) are provided to which air is supplied from the heat exchanger via tube 15. Tube 14 can be installed from the headers to a certain point on the equipment or circuit board where efficient point-like cooling is required. Alternatively, or to complement the said design, additional air can be drawn from the inlet side filter circuit. This design is outlined in the figure with the dashed line representing tube 16.

To improve heating efficiency, heating elements (not shown) can be mounted at desired points. This will make it easier to cold-start the equipment at low temperatures.

What is claimed is:

1. A system for cooling a cabinet having an enclosure containing telecommunications components, the system comprising:

a first set of cooling equipment comprising an air-to-air heat exchanger connectively coupled to the enclosure to transfer heat from an inside of the enclosure to an outside of the enclosure, a second set of cooling equipment comprising:
    a first opening in the enclosure forming an air inlet and a second opening in the enclosure forming an air outlet,
    at least one fan in fluid connection with the air inlet and the air outlet, the at least one fan configured to draw air outside the enclosure through the air inlet and forcing air inside the enclosure through the air outlet; and
    a switch controller coupled to the second set of cooling equipment,
    wherein the switch controller is configured to activate the second set of cooling equipment when a temperature outside the enclosure exceeds a predefined temperature limit and
    wherein the at least one fan of the second set of cooling equipment further comprises a suction fan in fluid connection with the air inlet and air inside the enclosure, and an outlet fan in fluid connection with the air outlet and air outside the enclosure, the air inlet and the air outlet being in fluid connection with the first set of cooling equipment.

2. The system in accordance with claim 1, wherein the predefined temperature limit is adjustable.

3. The system in accordance with claim 1, further comprising a plurality of air supply tubes in fluid connection with the first set of cooling equipment and the component location.

4. The system in accordance with claim 1, further comprising a plurality air supply tubes in fluid connection with the filter of the second set of cooling equipment and the component location.

5. A method of cooling an equipment cabinet, comprising:

transferring heat from an inside of the cabinet to an outside of the cabinet with a first set of cooling equipment, the first set of cooling equipment having an air-to-air heat exchanger convectively coupling air outside the cabinet with air inside the cabinet; and transferring heat from the inside to the outside of the cabinet with a second set of cooling equipment, the second set of cooling equipment having at least one fan drawing air from the outside of the cabinet through an air inlet and forcing air inside the cabinet out through an air outlet;

wherein the transferring step using the first set of cooling equipment is performed to maintain an air temperature inside the cabinet within a predefined temperature range and the transferring step using the second set of cooling equipment is performed when an air temperature outside the cabinet exceeds a predefined temperature limit, and wherein the at least one fan of the second set of cooling equipment further comprises a suction fan in fluid connection with the air inlet and air inside the enclosure, and an outlet fan in fluid connection with the air outlet and air outside the enclosure, and the transferring step using the second set of cooling equipment is performed using the suction fan and the outlet fan, through use of the air inlet and the air outlet which are in fluid connection with the first set of cooling equipment.

6. The method in accordance with claim 5, wherein the predefined temperature limit is adjustable.

7. The method in accordance with claim 5, further comprising moving the inside air to a component location in the equipment cabinet with a plurality of air supply tubes in fluid connection with the first set of cooling equipment and the component location.

8. The method in accordance with claim 5, further comprising moving the inside air to a component location in the equipment cabinet with a plurality of air supply tubes in fluid connection with the second set of cooling equipment and the component location.

9. A system for cooling a cabinet having an enclosure containing telecommunications components, the system comprising;

first cooling means for cooling by convectively transferring heat from air inside the enclosure to outside the enclosure, without transferring air between an inside and an outside of the enclosure;

second cooling means for cooling by drawing air outside the enclosure into the enclosure and forcing the air inside the enclosure out of the enclosure to transfer heat from the enclosure; and controlling means for controlling the second cooling means, wherein the controlling means is coupled to the second cooling means and is configured to activate the second cooling means when an air temperature outside the enclosure exceeds a predefined temperature limit;

wherein the enclosure is contained within the cabinet and the enclosure contains telecommunications components.

10. The system in accordance with claim 9, wherein the predefined temperature limit is adjustable.

11. The system in accordance with claim 9, further comprising a plurality of air supply means in fluid connection between the first cooling means and the component location.

12. The system in accordance with claim 9, further comprising a plurality of air supply means creating a fluid connection between the second cooling means and the component location.

* * * * *